United States Patent
Palaskas et al.

(10) Patent No.: US 6,580,324 B2
(45) Date of Patent: Jun. 17, 2003

(54) APPARATUS, METHOD AND SYSTEM FOR COMMON-MODE STABILIZATION IN CIRCUITS HAVING DIFFERENTIAL OPERATION

(75) Inventors: George Palaskas, New York, NY (US); Vladimir I. Prodanov, New Providence, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/951,291

(22) Filed: Sep. 12, 2001

(65) Prior Publication Data
US 2003/0048136 A1 Mar. 13, 2003

(51) Int. Cl.[7] ................................. H03F 3/45
(52) U.S. Cl. ........................ 330/258; 330/259
(58) Field of Search ................ 330/253, 258, 330/259

(56) References Cited

U.S. PATENT DOCUMENTS 4,616,189 A * 10/1986 Pengue ...................... 330/253
5,187,448 A * 2/1993 Brooks et al. ............. 330/258
6,462,618 B2 * 10/2002 Minegishi .................. 330/259

* cited by examiner

Primary Examiner—Steven J. Mottola
(74) Attorney, Agent, or Firm—Nancy R. Gamburd

(57) ABSTRACT

A system, method and apparatus are disclosed for common-mode voltage feedback. The preferred system includes a plurality of differential circuits, a corresponding plurality of common-mode voltage detectors, a corresponding plurality of buffer circuits, and a common-mode control circuit. Each differential circuit is operative to produce a first differential output voltage and a second differential output voltage. Each corresponding common-mode voltage detector is operative to provide a common-mode voltage from the first differential output voltage and the second differential output voltage. The common-mode control circuit provides a control voltage signal from the common-mode voltage and from a reference voltage. Each buffer circuit is operative to adjust the corresponding common-mode voltage using the control voltage signal to provide a common-mode feedback voltage signal to the corresponding differential circuit.

30 Claims, 6 Drawing Sheets

APPARATUS, METHOD AND SYSTEM FOR COMMON-MODE STABILIZATION IN CIRCUITS HAVING DIFFERENTIAL OPERATION

FIELD OF THE INVENTION

The present invention relates, in general, to integrated circuits and, more particularly, to an apparatus, method and system for providing common-mode stabilization, such as through feedback of a common-mode voltage, in integrated circuits having differential operation.

BACKGROUND OF THE INVENTION

Differential operation of integrated circuits ("ICs") such as amplifiers, operational amplifiers (op amps), and filters, is increasingly common. Such ICs having differential operation, referred to herein as differential circuits, operate utilizing two different input signals, a first or positive input signal, and a second or negative input signal (which is an inverse or 180 degree phase shifted version of the first input signal), and provide two output signals, a first (or positive) output signal, and a second (inverse or negative) output signal. Such differential circuits generally provide greater noise immunity compared to non-differential (or single-ended) circuits. For example, common-mode disturbances are rejected, as common-mode disturbances are generally equally coupled to the corresponding two outputs, and in a differential operation in which one output is subtracted from the other output, such common-mode disturbances are cancelled. Such differential operation, as a consequence, tends to reduce noise contributions both from substrate noise in the switching of ICs and from power supplies.

Differential circuits have additional advantages, such as superior linearity compared to non-differential circuits, due to suppression of even-order distortion products. Differential circuits are also comparatively faster, avoiding "mirror" poles in the signal path, and generally also have comparatively greater voltage swings.

In differential circuits, however, the positive and negative signals fluctuate or swing about a voltage midpoint, which must be maintained within a particular range for proper circuit operation. This voltage midpoint is typically defined through the use of additional circuitry, by detecting a common-mode voltage level ($V_{CM}$) of the two (positive ($V^+$) and negative ($V^-$)) output signals, defined as one-half of their sum, i.e., $V_{CM}=(V^++V^-)/2$. This common-mode voltage is detected, compared to a desired or reference value of the common-mode voltage level, with negative feedback utilized to correct any error in the detected common-mode voltage (i.e., to minimize any difference (error) between the reference voltage level and the detected common-mode voltage level.

Prior art methods generally utilize a comparatively high gain amplifier in the feedback circuit or path, to minimize the common-mode voltage error. Use of such high gain amplifiers, however, may result in stability issues due to a comparatively large number of poles. In addition, such amplifiers must operate at least as fast as the signal variation, further complicating the circuit design, requiring a high bandwidth, and generally consuming significant power.

As a consequence, a need remains for an apparatus, method and system which provide accurate common-mode voltage feedback without requiring high gain amplification in the feedback path. Such an apparatus, method and system should also be particularly suited for high bandwidth applications, and should provide comparatively low power dissipation.

SUMMARY OF THE INVENTION

A system, method and apparatus are disclosed for common-mode voltage feedback. The preferred system of the present invention includes a plurality of differential circuits, a corresponding plurality of common-mode voltage detectors, a corresponding plurality of buffer circuits, and one common-mode control circuit. Each differential circuit is operative to produce a first differential output voltage and a second differential output voltage. Each corresponding common-mode voltage detector is operative to provide a common-mode voltage from the first differential output voltage and the second differential output voltage. The common-mode control circuit provides a control voltage signal from the common-mode voltage and from a reference voltage. Each buffer circuit is operative to adjust the corresponding common-mode voltage using the control voltage signal to provide a common-mode feedback voltage signal to the corresponding differential circuit.

In the preferred embodiment, each buffer circuit is implemented as a source-follower circuit, and preferably as multiple stages of source-follower circuits. These buffer circuits replace the high gain amplifiers typically employed in the prior art.

One common-mode control circuit is utilized for the entire system. The common-mode control circuit provides the control voltage signal to each of the buffer circuits, to control the common-mode feedback voltage provided to each corresponding differential circuit.

This use of the buffer circuits with a common-mode control circuit of the present invention, in lieu of high gain amplifiers, provides for a significantly improved frequency response, and does so without the corresponding complexity of high gain amplifiers. Second, this use of the buffer circuits with a common-mode control circuit of the present invention provides for important power savings, significantly reducing power dissipation of the differential circuit ICs. In addition, the buffer and control circuits of the present invention may be implemented in a wide variety of designs and implementations, with reduced complexity, reduced chip area requirements, and corresponding fabrication efficiencies.

Numerous other advantages and features of the present invention will become readily apparent from the following detailed description of the invention and the embodiments thereof, from the claims and from the accompanying drawings.

DETAILED DESCRIPTION OF THE INVENTION

Figure 1:
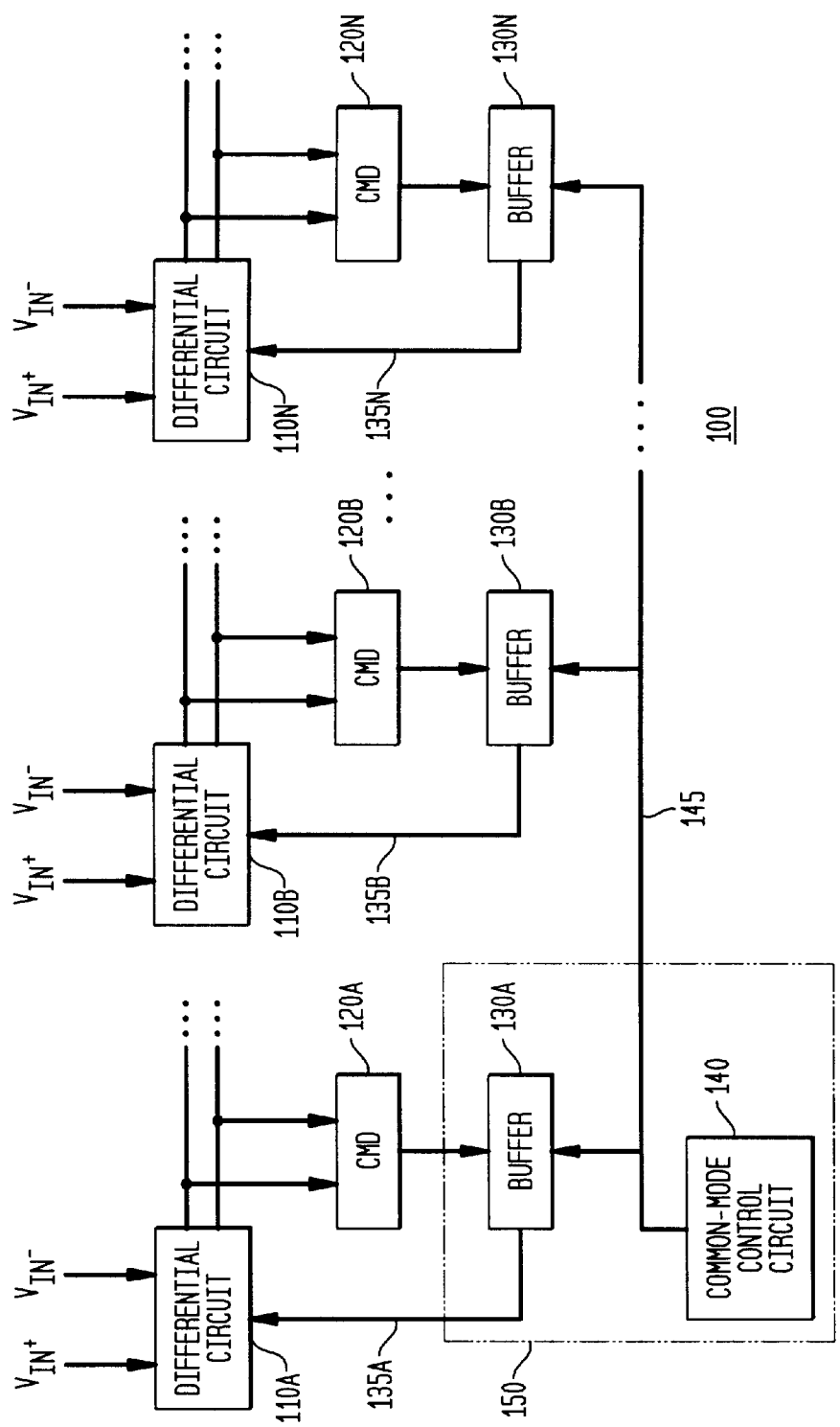
FIG. 1 is a block diagram illustrating a first, preferred system embodiment and an apparatus embodiment for common-mode voltage feedback in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As discussed in greater detail below, the present invention provides an apparatus, method and system for accurate common-mode voltage feedback, without requiring high gain amplification in the feedback path. The preferred apparatus, method and system of the present invention are also particularly suited for high bandwidth applications, and provide comparatively low power dissipation.

FIG. 1 is a block diagram illustrating a first, preferred system embodiment 100 and an apparatus embodiment 150 for common-mode voltage feedback in accordance with the present invention. As illustrated in FIG. 1, the system 100 includes one or more differential circuits 110, illustrated as differential circuits 110A, 110B, through 110N. (As used herein, references such as A, B, . . . N, and Z, following a numeric reference such as 110, 120 or 130, are utilized to refer to a particular instantiation or embodiment of the general type of circuit or function referred to, such as, for example, differential circuit 110A is an instantiation of any one of a plurality of differential circuits 110, such as a differential amplifier or a differential filter). To provide common-mode voltage feedback for each differential circuit 110, the system 100 includes a corresponding plurality of common-mode voltage detectors ("CMDs") 120, illustrated as CMDs 120A through 120N, and a corresponding plurality of buffers (or buffer circuits) 130, illustrated as buffers 130A through 130N. As illustrated, the system 100 utilizes one CMD 120 and one buffer 130 for each corresponding differential circuit 110 which will have common-mode voltage feedback (via lines or conductors 135, illustrated as lines 135A through 135N). A representative or exemplary differential circuit 110 and common-mode voltage detector 120 are discussed below with reference to FIG. 2. Preferred buffer circuits 130 are discussed below with reference to FIGS. 3 and 4. It should be noted that, in the prior art, high-gain amplifiers would be utilized, instead of the buffers 130 of the present invention, to provide common-mode voltage feedback. This use of buffers 130 in the present invention, however, provides greater bandwidth and faster switching capabilities compared to such prior art amplifiers.

Figure 2:
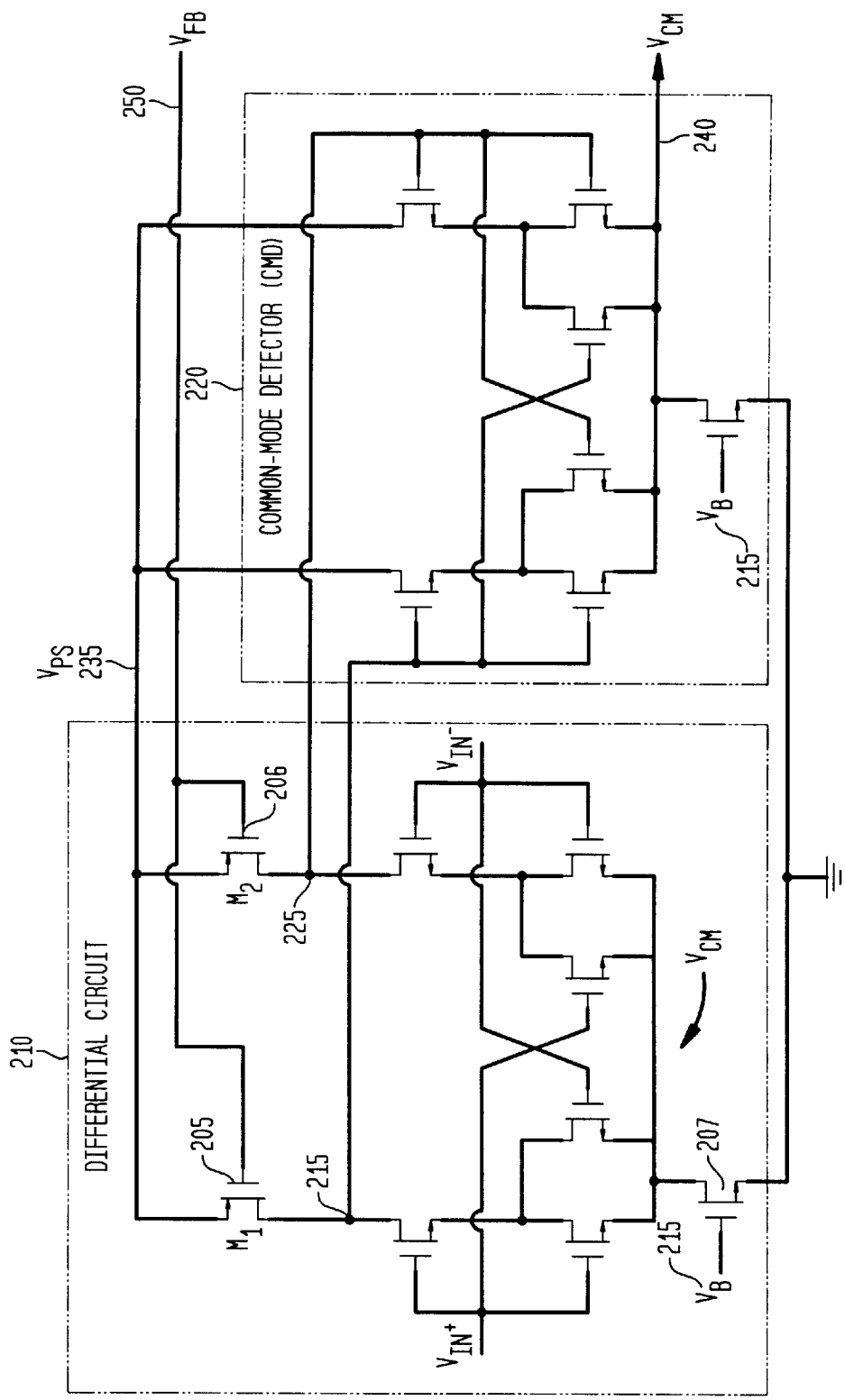
FIG. 2 is a schematic diagram illustrating a representative or exemplary differential circuit and a representative or exemplary common-mode voltage detector for use in the preferred system embodiment for common-mode voltage feedback in accordance with the present invention.

Continuing to refer to FIG. 1, the preferred system 100 utilizes one common-mode control circuit 140 for the entire system. A preferred common-mode control circuit 140 is discussed in greater detail below with reference to FIG. 5, and in the preferred embodiment, is also comprised of a differential circuit 110, a CMD 120 and a buffer 130, with an additional amplifier. This use of a singular common-mode control circuit 140 is also a significant departure from prior art systems, which would provide duplicative control circuitry within each corresponding high-gain amplifier. As discussed in greater detail below, the use of the buffer circuits 130 in the present invention allows for such concentration of control within a singular common-mode control circuit 140, with a resulting control signal distributed to each corresponding buffer 130 (via a line or conductor 145), and with a corresponding reduction of power consumption and dissipation. With the control signal, the various buffers 130 then adjust the common-mode voltage feedback level provided to the corresponding differential circuits 110 via lines or conductors 135. The preferred apparatus 150 embodiment, as a consequence, includes the common-mode control circuit 140 and a buffer circuit 130. FIG. 2 is a schematic diagram illustrating a representative or exemplary differential circuit 210 and a representative or exemplary common-mode voltage detector (CMD) 220 for use in the preferred system embodiment for common-mode voltage feedback in accordance with the present invention. As illustrated, the differential circuit 210 and CMD 220 are cross-coupled transconductors, with an active load associated with differential circuit 210, illustrated as transistors $M_1$ (205) and $M_2$ (206), connected to a power supply (or rail), $V_{PS}$ 235. This cross-coupled structure may correspond to a gyrator used in a resonator. The CMD 220 is utilized in lieu of alternative structures, such as a resistive voltage divider, which would lower the DC gain in the filter, or an integrated filter, which would diminish the accuracy of the frequency response, or a voltage follower, which would reduce the output swing while increasing power consumption and adding an extra pole to the feedback loop.

Continuing to refer to FIG. 2, the desired common-mode voltage level ($V_{FB}$) is fed back to the gates of transistors $M_1$ (205) and $M_2$ (206). Without such feedback, the voltages sensed at the outputs (nodes 215 and 225) would tend to be ill defined. For example, if a fixed bias were used for the gates of transistors $M_1$ (205) and $M_2$ (206), a small mismatch between their currents and the current flowing through transistor 207 (having gate bias voltage $V_B$) could drive these various transistors into a triode state. In this embodiment, using the second transconductor (CMD 220), the common-mode voltage (of nodes 215 and 225) is sensed as a scaled (or level-adjusted) common-source voltage, at node or line 240 (i.e., the detected common-source voltage is equal to the combined voltage of output nodes 215 and 225 minus threshold (gate-source) and other voltages of the intervening transistors). Other equivalent embodiments may be readily apparent, as any transconductor that has its inputs connected to the output nodes (whose common-mode voltage is to be sensed) may be utilized. As discussed in greater detail below, the detected or sensed common-mode voltage level, $V_{CM}$, such as the voltage level at the common-source (node or line 240), will be utilized by the various buffer circuits 130 and common-mode control circuit 140 to provide a common-mode feedback voltage ($V_{FB}$), for example, on line 250 to the gates of transistors $M_1$ (205) and $M_2$ (206), or to any other feedback inputs or feedback nodes of a differential circuit 110.

It should be noted, throughout the various Figures, that the present invention is illustrated utilizing various p-type and n-type transistors, and in particular, field-effect transistors (FETs). Equivalent embodiments should also be readily apparent to those of skill in the art, both using other types of transistors and interchanging p-type and n-type transistors with corresponding changes in applied bias and power supply voltages, and are correspondingly included within the scope of the present invention.

Figure 3:
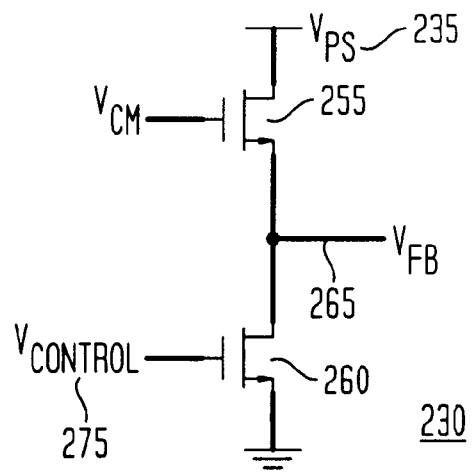
FIG. 3 is a schematic diagram illustrating a first buffer circuit for use in the preferred system and apparatus embodiments for common-mode voltage feedback in accordance with the present invention.

FIG. 3 is a schematic diagram illustrating a first buffer circuit 230 for use in the preferred system 100 and apparatus 150 embodiments for common-mode voltage feedback in accordance with the present invention. For example, buffer circuit 230 may be utilized as one of the plurality of buffers 130 of FIG. 1. As illustrated in FIG. 3, the sensed or detected common-mode voltage $V_{CM}$ (such as from node or line 240) is applied to the gate of transistor 255, with the common-mode feedback voltage $V_{FB}$ (to be fed back on line 135 of FIG. 1 or line 250 of FIG. 2) determined at node 265. As buffer 230 is configured as a source-follower circuit, in general, $V_{FB}$ is proportional to $V_{CM}$ minus a threshold voltage of transistor 255 ($V_{TH}$), and minus a voltage referred to as $\Delta V$, which is dependent on the length, width and current flowing through the transistors 255 and 260. As discussed in greater detail below, to adjust $V_{FB}$ independently of the temperature and processing conditions which may affect $\Delta V$, a control voltage $V_{CONTROL}$ (275) is applied to the gate of second transistor 260, resulting in control of the corresponding bias current through this device.

Figure 4:
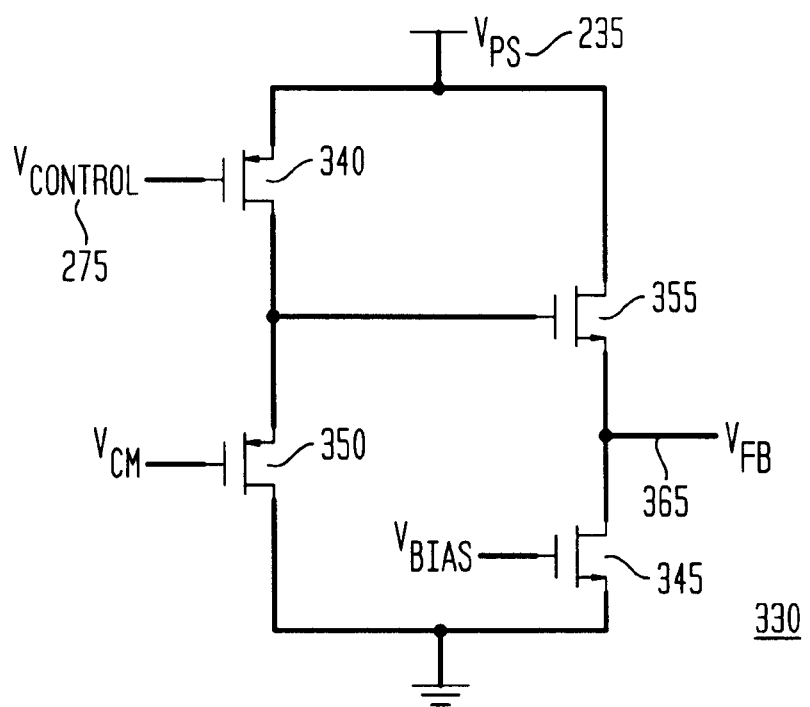
FIG. 4 is a schematic diagram illustrating a second buffer circuit for use in the preferred system and apparatus embodiments for common-mode voltage feedback in accordance with the present invention.

FIG. 4 is a schematic diagram illustrating a second buffer circuit 330 for use in the preferred system 100 and apparatus 150 embodiments for common-mode voltage feedback in accordance with the present invention. For example, buffer circuit 330 may be utilized as one of the plurality of buffers 130 of FIG. 1. As illustrated in FIG. 4, buffer 330 is formed as a two-stage chain or coupling of source-follower buffer circuits, such as a coupling of two buffers 230, and may be extended to additional stages. Also as illustrated in FIG. 4, the sensed or detected common-mode voltage $V_{CM}$ (such as from node or line 240) is applied to the gate of transistor 350, with the feedback voltage $V_{FB}$ (to be fed back on line 135 of FIG. 1 or line 250 of FIG. 2) determined at node 365. A bias voltage is applied to the gate of transistor 345. As buffer 330 is configured as stages of source-follower circuits, in general, $V_{FB}$ is proportional to $V_{CM}$, plus and minus threshold voltages of transistors 350 and 355, and plus and minus voltages referred to as $\Delta V_1$ and $\Delta V_2$, which are also dependent on the length, width and current flowing through the various transistors (340, 345, 350 and 355). As discussed in greater detail below, to adjust $V_{FB}$ independently of the temperature and processing conditions which may affect $\Delta V_1$ and $\Delta V_2$, a control voltage $V_{CONTROL}$ (275) is applied to the gate of transistor 340, also resulting in control of the corresponding bias currents through these devices.

Figure 5:
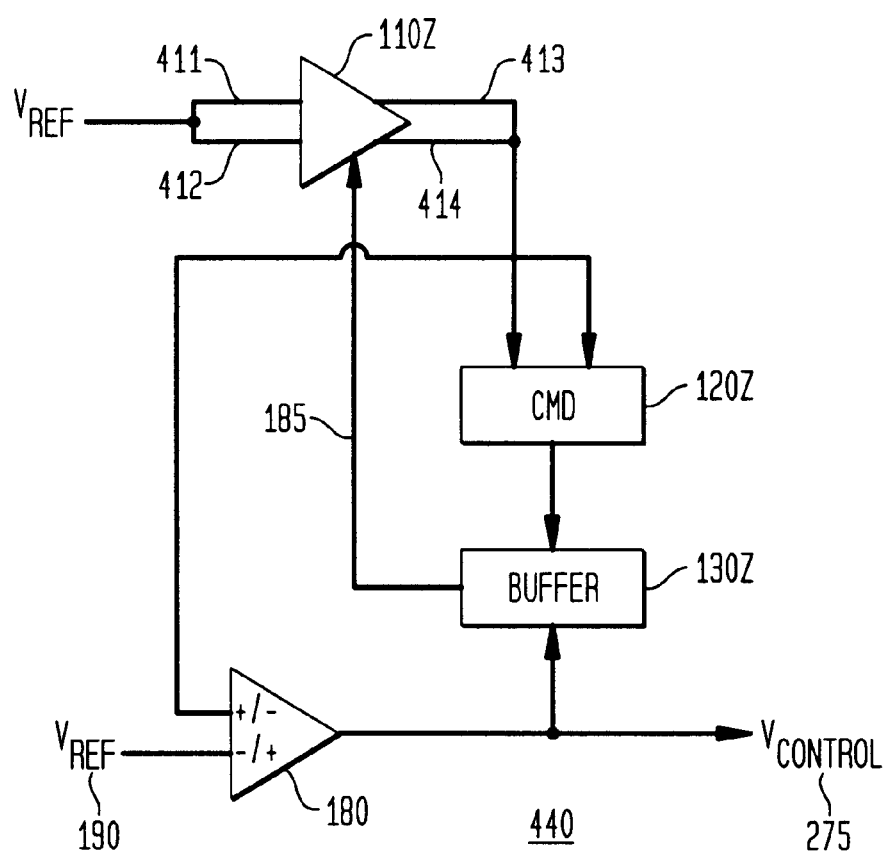
FIG. 5 is a block diagram illustrating a representative or exemplary common-mode voltage control circuit for use in the preferred system and apparatus embodiments for common-mode voltage feedback in accordance with the present invention.

As indicated above, to provide adjustment of the common-mode feedback voltage $V_{FB}$ independently of IC temperature and processing conditions, a control voltage $V_{CONTROL}$ (275) is generated as a control signal from the common-mode control circuit 140, and is distributed to each of the various buffers 130 (which may be variously embodied as buffers 230, 330 or their equivalents). In the preferred embodiment, such a common-mode control circuit 140 is implemented to provide "replica-biasing", preferably utilizing one of the differential circuits 110, CMD 120 and buffer 130 which have been arrayed or distributed on an IC. FIG. 5 is a block diagram illustrating a representative or exemplary common-mode voltage control circuit 440 for use in the preferred system 100 and apparatus 150 embodiments for common-mode voltage feedback in accordance with the present invention. In FIG. 5, while a differential circuit 110Z is illustrated as a differential operational amplifier, it should be understood that any type of differential circuit 110 might be utilized.

Referring to FIG. 5, in accordance with the present invention, the inputs and outputs of the differential circuit 110Z are collapsed, namely, the inputs 411 and 412 are coupled to each other and to a reference voltage $V_{REF}$, and the outputs 413 and 414 are also coupled to each other. The combined outputs 413 and 414 provide the nodes for determining a common-mode voltage, equivalently to nodes 215 and 225 in FIG. 2, and are input into CMD 120Z and to a first input of an amplifier 180 (which is preferably and is illustrated as an operational amplifier, or may also be a high gain op amp). The output of the CMD 120Z is input into buffer 130Z, which may be implemented as a buffer 230 or 330, and which provides the common-mode voltage feedback $V_{FB}$ to differential circuit 110Z on line 185. A reference voltage $V_{REF}$ (190), set to a desired or selected level of the common-mode voltage, is provided to a second input of amplifier 180. As a consequence, the common-mode voltage at outputs 413 and 414 of differential circuit 110Z is forced to (approximately) the desired level of the reference voltage $V_{REF}$, through the output of the amplifier 180; namely, common-mode control signal $V_{CONTROL}$ (275) is provided to the buffer 130Z (and other buffers 130 of system 100), which in turn adjusts the common-mode voltage feedback $V_{FB}$ provided to differential circuit 110Z (and, correspondingly, the other differential circuits 110 of the system 100), which in turn, adjusts the common-mode voltage at nodes 413 and 414, and so on. As a consequence, the common-mode control circuit 140, such as the common-mode control circuit 440 of FIG. 5, provides for all the common-mode voltages $V_{CM}$ in the system 100 to be at a desired level, $V_{REF}$, through corresponding common-mode feedback voltages $V_{FB}$, independently of the temperature and processing conditions of the IC. In addition, the amplifier 180 is not utilized for signal processing and, as a consequence, is not subject to any of the speed and bandwidth requirements applicable the differential circuits 110. Lastly, the choice of positive and inverting inputs into amplifier 180 may be adjusted to provide an appropriate control voltage level, depending upon the various buffer configurations selected for the system 100, such as positive and inverting configurations.

Alternative configurations of the common-mode voltage control circuit 440 may also be utilized. For example, rather than utilizing collapsed or combined outputs from differential circuit 110Z, the differential outputs may be maintained and input into CMD 120Z. The detected common-mode voltage output of CMD 120Z may then be provided to an input of amplifier 180 (rather than using the input coupled to combined output nodes 413 and 414). For this configuration, however, the reference voltage applied to the amplifier 180 should be level-adjusted to correspondingly account for the voltage difference introduced by CMD 120Z, such as by using an additional CMD 120 prior to being input into amplifier 180, thereby forming a "second" reference voltage. Additional variations will also be apparent to those of skill in the art, and are included within the scope of the invention.

Figure 6:
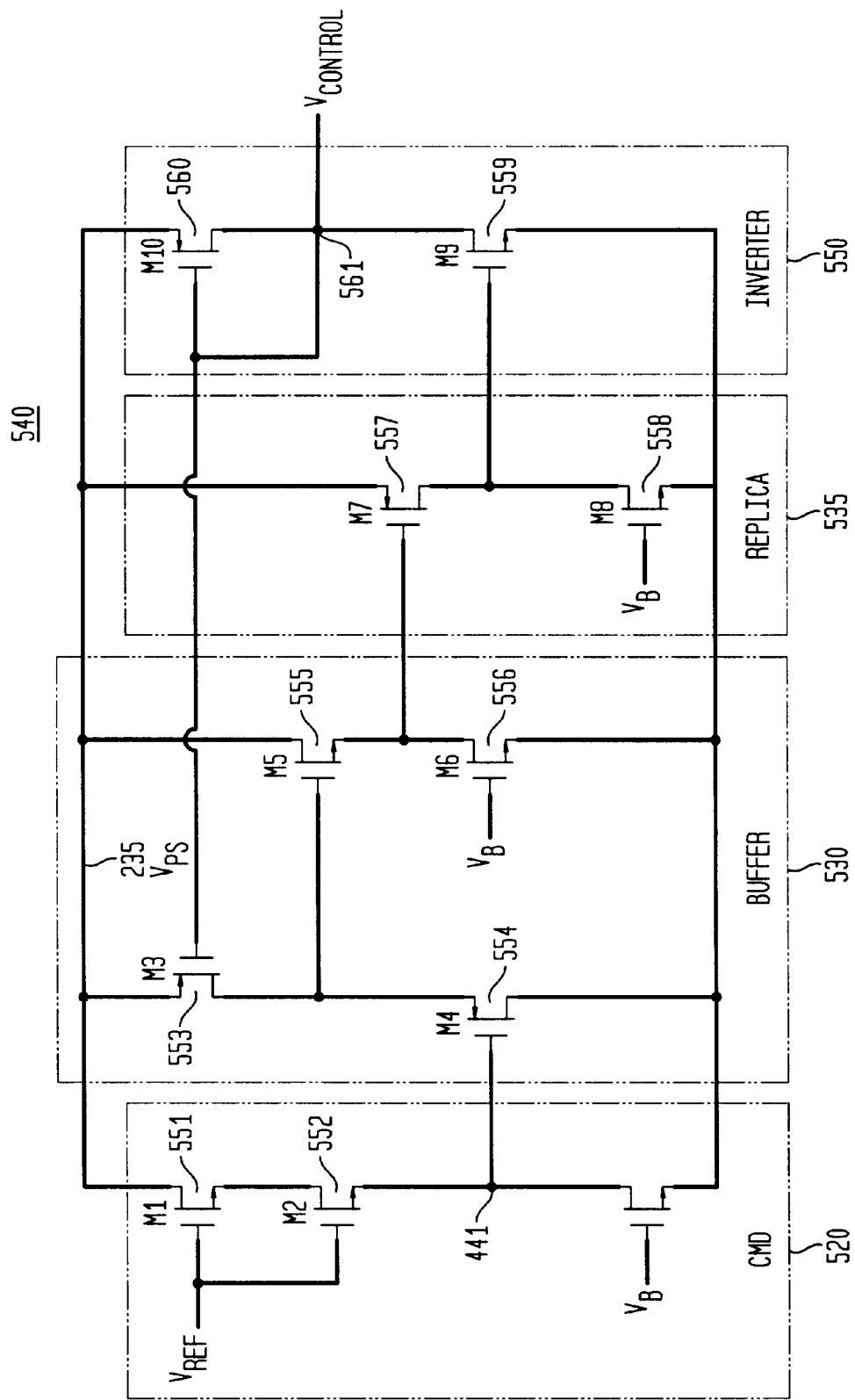
FIG. 6 is a block diagram illustrating a second common-mode voltage control circuit for use in system and apparatus embodiments for common-mode voltage feedback in accordance with the present invention.

FIG. 6 is a block diagram illustrating a second common-mode voltage control circuit 540 for use in system 100 and apparatus 150 embodiments for common-mode voltage feedback in accordance with the present invention. Rather than utilizing a high gain op amp 180 of common-mode voltage control circuit 440, in common-mode voltage control circuit 540, an inverter 550 arrangement is utilized, with the desired common-mode voltage $V_{REF}$ applied directly to input gates (of transistors 551 and 552) of a common-mode voltage detector (CMD) 520. The voltage developed at node 441, namely, a second common-mode voltage, is then level-shifted or adjusted, via buffer 530, and applied to the gate of transistor 557, which is preferably matched to the active load of the differential circuit 110 (such as transistors 205 and 206 of FIG. 2), as "replica" 535, with the current developed being identical to the bias current of the differential circuit 110, such as transconductor 210 of FIG. 2). Any error is then amplified by transistor 559 of inverter 550, with corresponding voltage fed back to the gate of transistor 553 to adjust the voltage level shifting. The control voltage $V_{CONTROL}$ (at node 561) may then be used to bias the buffer circuits 130 all of the common-mode feedback circuits of the system 100. It should be noted that such level-shifting adjustment of FIG. 6 also provides a common-mode voltage $V_{CM}$ approximately set to a reference value, $V_{REF}$, regardless of temperature and process variations.

Figure 7:
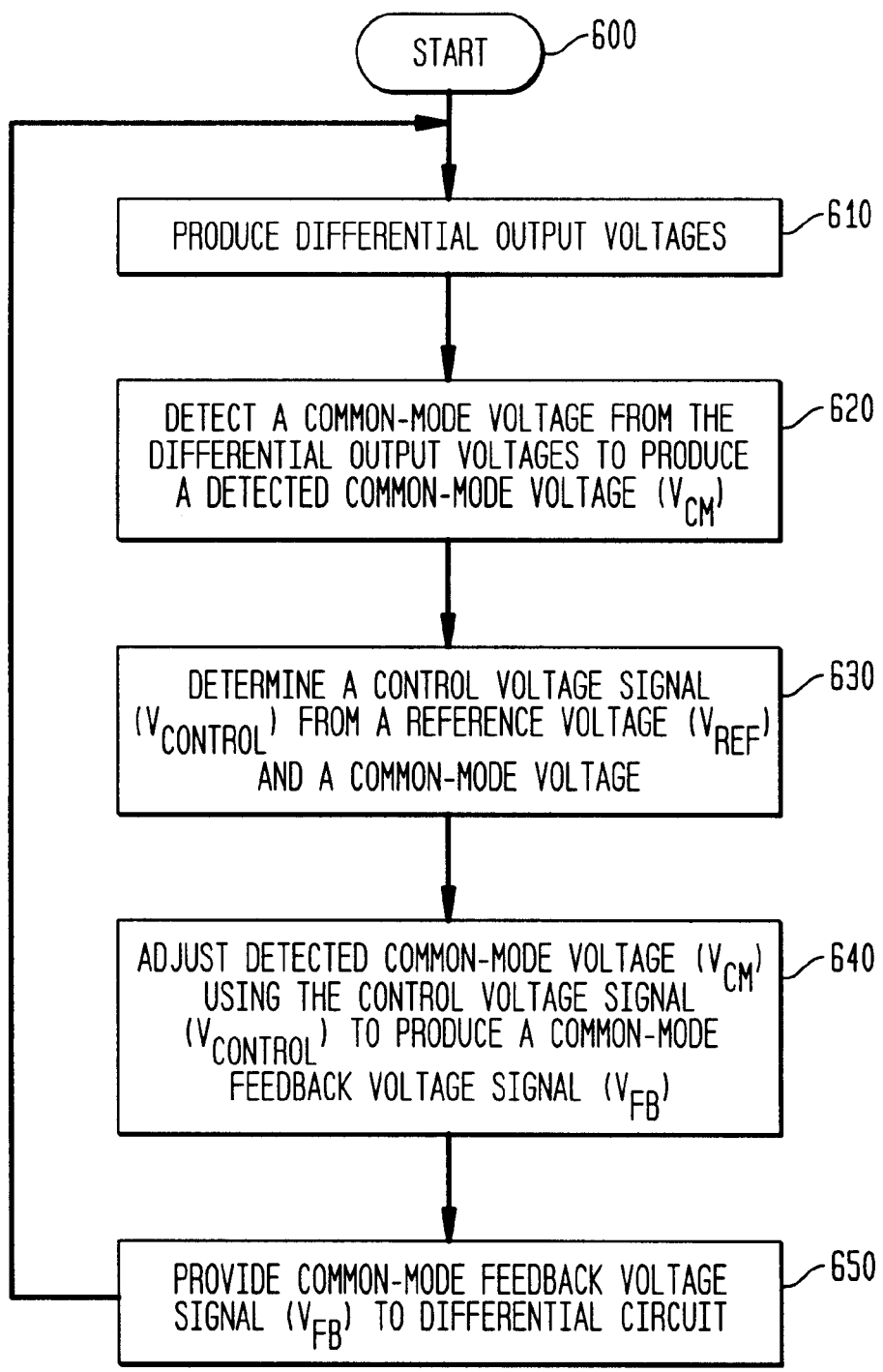
FIG. 7 is a flow diagram illustrating a preferred method embodiment for common-mode voltage feedback in accordance with the present invention.

FIG. 7 is a flow diagram illustrating a preferred method embodiment for common-mode voltage feedback in accordance with the present invention, and provides a useful summary. The method begins, start step 600, with the production of differential output voltages, step 610, such as by a differential circuit 110, such as at nodes 215 and 225 of FIG. 2. Next, using the differential output voltages, a common-mode voltage is detected, step 620, preferably by a corresponding CMD 120, to provide a detected common-mode voltage $V_{CM}$. A control voltage signal ($V_{CONTROL}$) is then determined, such as by op amp 180, using a reference voltage and a common-mode voltage, step 630. It should be noted, for step 630, that this common-mode voltage is preferably obtained directly from combined outputs of a differential circuit 110, such the combined outputs 413 and 414 of FIG. 5. Preferably using a buffer circuit 130 having two inputs, one input for $V_{CM}$ and a second input for $V_{CONTROL}$ (such as respective inputs 255 and 260 of FIG. 3 or respective inputs 350 and 340 with 345 of FIG. 4), in step 640, the detected common-mode voltage is adjusted utilizing the control voltage signal $V_{CONTROL}$, to produce a common-mode feedback voltage, $V_{FB}$. The common-mode feedback voltage $V_{FB}$ is then provided to inputs of the differential circuit 110, step 650, for use in providing the differential output voltages, returning to step 610. This feedback loop of the method continues for as long as the differential circuit is operational and, as a consequence, no ending or return step is separately illustrated in FIG. 7.

Numerous advantages of the present invention are readily apparent. First, the use of the buffer circuits with a common-mode control circuit of the present invention, in lieu of high gain amplifiers, provides for a significantly improved frequency response, and does so without the corresponding complexity of high gain amplifiers. Second, this use of the buffer circuits with a common-mode control circuit of the present invention provides for important power savings, significantly reducing power dissipation of the differential circuit ICs. In addition, the buffer and control circuits of the present invention may be implemented in a wide variety of designs and implementations, with reduced complexity, reduced chip area requirements, and corresponding fabrication efficiencies.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A system for common-mode voltage feedback, the system comprising:

a first differential circuit, the first differential circuit operative to produce a first differential output voltage and a second differential output voltage;

a first common-mode voltage detector coupled to the first differential circuit, the first common-mode voltage detector operative to provide a detected common-mode voltage from the first differential output voltage and the second differential output voltage;

a common-mode control circuit operative to provide a control voltage signal from a common-mode voltage and from a reference voltage; and a first buffer coupled to the first common-mode voltage detector, to the first differential circuit, and to the common-mode control circuit, the first buffer operative to adjust the detected common-mode voltage using the control voltage signal to provide a common-mode feedback voltage signal to the first differential circuit.

2. The system of claim 1, wherein the first differential circuit is operative to adjust the first differential output voltage and the second differential output voltage in response to the common-mode feedback voltage signal.

3. The system of claim 1, wherein the first buffer is a source-follower circuit.

4. The system of claim 1, wherein the first buffer further comprises:

a first transistor having a first gate and a source, the first gate providing a first buffer input for the detected common-mode voltage, the source providing an output for the common-mode feedback voltage signal; and a second transistor having a drain coupled to the source of the first transistor and further having a second gate, the second gate providing a second buffer input for the control voltage signal.

5. The system of claim 1, wherein the first buffer is comprised of a plurality of stages, wherein each stage of the plurality of stages is a source-follower circuit.

6. The system of claim 1, wherein the first buffer is comprised of a first stage and a second stage of a plurality of stages, and wherein:

the first stage includes a first transistor having a first gate and a first source, the first gate providing a first buffer input for the control voltage signal, the source providing a first stage output; and the first stage further including a second transistor having a drain coupled to the source of the first transistor and further having a second gate, the second gate providing a second buffer input for the detected common-mode voltage; and the second stage includes a third transistor having a third gate and a third source, the third gate coupled to the first stage output, the third source providing an output for the common-mode feedback voltage signal; and the second stage further including a fourth transistor having a drain coupled to the third source of the third transistor and further having a fourth gate, the fourth gate coupled to a bias voltage.

7. The system of claim 1, wherein the common-mode control circuit further comprises:

a second differential circuit, the second differential circuit having a first differential output and a second differential output, the first differential output coupled to the second differential output to provide a second common-mode voltage;

a second common-mode voltage detector coupled to the second differential circuit, the second common-mode voltage detector operative to provide a third common-mode voltage from the first differential output and the second differential output;

an amplifier having a first amplifier input and having a second amplifier input, the first amplifier input coupled to the second differential circuit for input of the second common-mode voltage, and the second amplifier input for input of the reference voltage, the amplifier operative to provide the control voltage signal; and a second buffer coupled to the second common-mode voltage detector, to the second differential circuit, and to the amplifier, the second buffer operative to adjust the third common-mode voltage using the control voltage signal to provide the common-mode feedback voltage signal to the second differential circuit.

8. The system of claim 1, wherein the common-mode control circuit further comprises:

a second differential circuit, the second differential circuit having a first differential output and a second differential output;

a second common-mode voltage detector coupled to the second differential circuit, the second common-mode voltage detector operative to provide a second common-mode voltage from the first differential output and the second differential output;

an amplifier having a first amplifier input and having a second amplifier input, the first amplifier input coupled to the second common-mode voltage detector for input of the second common-mode voltage, and the second amplifier input for input of a second reference voltage, the operational amplifier operative to provide the control voltage signal; and a second buffer coupled to the second common-mode voltage detector, to the second differential circuit, and to the amplifier, the second buffer operative to adjust the second common-mode voltage using the control voltage signal to provide the common-mode feedback voltage signal to the second differential circuit.

9. The system of claim 1, wherein the common-mode control circuit further comprises:

a second common-mode voltage detector operative to provide a second common-mode voltage from the reference voltage;

an inverter operative to provide the-control voltage signal; and a second buffer coupled to the second common-mode voltage detector and to the inverter, the second buffer operative to adjust the second common-mode voltage using the control voltage signal.

10. The system of claim 1, wherein the differential circuit is selected from a plurality of differential circuits, the plurality of differential circuits including an amplifier, an operational amplifier, a transconductor, and a filter.

11. An apparatus for providing common-mode voltage feedback to a first differential circuit, the apparatus comprising:

a common-mode control circuit operative to provide a control voltage signal from a common-mode voltage and from a reference voltage; and a first buffer coupled to the common-mode control circuit, the first buffer operative to adjust the common-mode voltage using the control voltage signal to provide a common-mode feedback voltage signal to the first differential circuit.

12. The apparatus of claim 11, wherein the first buffer is a source-follower circuit.

13. The apparatus of claim 11, wherein the first buffer further comprises:

a first transistor having a first gate and a source, the first gate providing a first buffer input for the common-mode voltage, the source providing an output for the common-mode feedback voltage signal; and a second transistor having a drain coupled to the source of the first transistor and further having a second gate, the second gate providing a second buffer input for the control voltage signal.

14. The apparatus of claim 11, wherein the first buffer is comprised of a plurality of stages, wherein each stage of the plurality of stages is a source-follower circuit.

15. The apparatus of claim 11, wherein the first buffer is comprised of a first stage and a second stage of a plurality of stages, and wherein:

the first stage includes a first transistor having a first gate and a first source, the first gate providing a first buffer input for the control voltage signal, the source providing a first stage output; and the first stage further including a second transistor having a drain coupled to the source of the first transistor and further having a second gate, the second gate providing a second buffer input for the common-mode voltage; and the second stage includes a third transistor having a third gate and a third source, the third gate coupled to the first stage output, the third source providing an output for the common-mode feedback voltage signal; and the second stage further including a fourth transistor having a drain coupled to the third source of the third transistor and further having a fourth gate, the fourth gate coupled to a bias voltage.

16. The apparatus of claim 11, wherein the common-mode control circuit further comprises:

a second differential circuit, the second differential circuit having a first differential output and a second differential output, the first differential output coupled to the second differential output to provide a second common-mode voltage;

a common-mode voltage detector coupled to the second differential circuit, the second common-mode voltage detector operative to provide a third common-mode voltage from the first differential output and the second differential output;

an amplifier having a first amplifier input and having a second amplifier input, the first amplifier input coupled to the second differential circuit for input of the second common-mode voltage, and the second amplifier input for input of the reference voltage, the amplifier operative to provide the control voltage signal; and a second buffer coupled to the common-mode voltage detector, to the second differential circuit, and to the amplifier, the second buffer operative to adjust the third common-mode voltage using the control voltage signal to provide the common-mode feedback voltage signal to the second differential circuit.

17. The apparatus of claim 11, wherein the common-mode control circuit further comprises:

a second differential circuit, the second differential circuit having a first differential output and a second differential output;

a common-mode voltage detector coupled to the second differential circuit, the common-mode voltage detector operative to provide a second common-mode voltage from the first differential output and the second differential output;

an amplifier having a first amplifier input and having a second amplifier input, the first amplifier input coupled to the common-mode voltage detector for input of the second common-mode voltage, and the second amplifier input for input of a second reference voltage, the amplifier operative to provide the control voltage signal; and a second buffer coupled to the common-mode voltage detector, to the second differential circuit, and to the amplifier, the second buffer operative to adjust the second common-mode voltage using the control voltage signal to provide the common-mode feedback voltage signal to the second differential circuit.

18. The apparatus of claim 11, wherein the common-mode control circuit further comprises:

a common-mode voltage detector operative to provide a second common-mode voltage from the reference voltage;

an inverter operative to provide the control voltage signal; and a second buffer coupled to the common-mode voltage detector and to the inverter, the second buffer operative to adjust the second common-mode voltage using the control voltage signal.

19. A method for providing common-mode voltage feedback to a differential circuit; the method comprising:

producing a first differential output voltage and a second differential output voltage;

detecting a common-mode voltage from the first differential output voltage and the second differential output voltage;

determining a control voltage signal from a reference voltage and the common-mode voltage;

adjusting the common-mode voltage using the control voltage signal to produce a common-mode voltage feedback signal; and providing the common-mode voltage feedback signal to the differential circuit.

20. A system for providing common-mode voltage feedback; the system comprising:

means for producing a first differential output voltage and a second differential output voltage;

means for detecting a common-mode voltage from the first differential output voltage and the second differential output voltage;

means for determining a control voltage signal from a reference voltage and the common-mode voltage; and means for adjusting the common-mode voltage using the control voltage signal to produce a common-mode voltage feedback signal.

21. The system of claim 20, wherein the means for producing a first differential output voltage and a second differential output voltage is operative to adjust the first differential output voltage and the second differential output voltage in response to the common-mode feedback voltage signal.

22. The system of claim 20, wherein the means for adjusting the common-mode voltage using the control voltage signal to produce a common-mode voltage feedback signal is a buffer, source-follower circuit having a first buffer input for the detected common-mode voltage, a second buffer input for the control voltage signal, and an output for the common-mode feedback voltage signal.

23. The system of claim 20, wherein the means for adjusting the common-mode voltage using the control voltage signal to produce a common-mode voltage feedback signal is a buffer circuit comprised of a plurality of stages, wherein each stage of the plurality of stages is a source-follower circuit.

24. The system of claim 20, wherein the means for determining a control voltage signal from a reference voltage and the common-mode voltage further comprises:

a differential circuit, the differential circuit having a first differential output and a second differential output, the first differential output coupled to the second differential output to provide a second common-mode voltage;

a common-mode voltage detector coupled to the differential circuit, the common-mode voltage detector operative to provide a third common-mode voltage from the first differential output and the second differential output;

an amplifier having a first amplifier input and having a second amplifier input, the first amplifier input coupled to the differential circuit for input of the second common-mode voltage, and the second amplifier input for input of the reference voltage, the amplifier operative to provide the control voltage signal; and a buffer coupled to the common-mode voltage detector, to the differential circuit, and to the amplifier, the buffer operative to adjust the third common-mode voltage using the control voltage signal to provide the common-mode feedback voltage signal to the differential circuit.

25. The system of claim 20, wherein the means for determining a control voltage signal from a reference voltage and the common-mode voltage further comprises:

a differential circuit, the differential circuit having a first differential output and a second differential output;

a common-mode voltage detector coupled to the differential circuit, the common-mode voltage detector operative to provide a second common-mode voltage from the first differential output and the second differential output;

an amplifier having a first amplifier input and having a second amplifier input, the first amplifier input coupled to the common-mode voltage detector for input of the second common-mode voltage, and the second amplifier input for input of a second reference voltage, the operational amplifier operative to provide the control voltage signal; and a buffer coupled to the common-mode voltage detector, to the differential circuit, and to the amplifier, the buffer operative to adjust the second common-mode voltage using the control voltage signal to provide the common-mode feedback voltage signal to the differential circuit.

26. The system of claim 20, wherein the means for determining a control voltage signal from a reference voltage and the common-mode voltage further comprises:

a common-mode voltage detector operative to provide a second common-mode voltage from the reference voltage;

an inverter operative to provide the control voltage signal; and a buffer coupled to the common-mode voltage detector and to the inverter, the buffer operative to adjust the second common-node voltage using the control voltage signal.

27. A system for common-mode voltage feedback, the system comprising:

a plurality of differential circuits, each differential circuit plurality of differential circuits operative to produce a corresponding first differential output voltage and a corresponding second differential output voltage;

a plurality of common-mode voltage detectors, each common-mode voltage detector of the plurality of common-mode voltage detectors correspondingly coupled to a differential circuit of the plurality of differential circuits, each common-mode voltage detector of the plurality of common-mode voltage detectors operative to provide a corresponding common-mode voltage from the corresponding first differential output voltage and the corresponding second differential output voltage;

a common-mode control circuit operative to provide a control voltage signal from a common-mode voltage and from a reference voltage; and a plurality of buffer circuits, each buffer circuit of the plurality of buffer circuits coupled to a corresponding common-mode voltage detector of the plurality of common-mode voltage detectors and to a corresponding differential circuit of the plurality of differential circuits, the plurality of buffer circuits further coupled to the common-mode control circuit, each buffer circuit of the plurality of buffer circuits correspondingly operative to adjust the corresponding common-mode voltage using the control voltage signal to provide a corresponding common-mode feedback voltage signal to the corresponding differential circuit.

28. The system of claim 27, wherein the common-mode control circuit further comprises:

a selected differential circuit of the plurality of differential circuits, the selected differential circuit having a first differential output and a second differential output, the first differential output coupled to the second differential output to provide a second common-mode voltage;

a selected common-mode voltage detector of the plurality of common-mode voltage detectors, the selected common-mode voltage detector coupled to the selected differential circuit, the selected common-mode voltage detector operative to provide a third common-mode voltage from the first differential output and the second differential output;

an amplifier having a first amplifier input and having a second amplifier input, the first amplifier input coupled to the selected differential circuit for input of the second common-mode voltage, and the second amplifier input for input of the reference voltage, the amplifier operative to provide the control voltage signal; and a selected buffer circuit of the plurality of buffer circuits, the selected buffer circuit coupled to the selected common-mode voltage detector, to the selected differential circuit, and to the amplifier, the selected buffer circuit operative to adjust the third common-mode voltage using the control voltage signal to provide the common-mode feedback voltage signal to the selected differential circuit.

29. The system of claim 27, wherein the common-mode control circuit further comprises:

a selected differential circuit of the plurality of differential circuits, the selected differential circuit having a first differential output and a second differential output;

a selected common-mode voltage detector of the plurality of common-mode voltage detectors, the selected common-mode voltage detector coupled to the selected differential circuit, the selected common-mode voltage detector operative to provide a second common-mode voltage from the first differential output and the second differential output;

an amplifier having a first amplifier input and having a second amplifier input, the first amplifier input coupled to the selected common-mode voltage detector for input of the second common-mode voltage, and the second amplifier input for input of a second reference voltage, the amplifier operative to provide the control voltage signal; and a selected buffer circuit of the plurality of buffer circuits, the selected buffer circuit coupled to the selected common-mode voltage detector, to the selected differential circuit, and to the amplifier, the selected buffer operative to adjust the second common-mode voltage using the control voltage signal to provide the common-mode feedback voltage signal to the selected differential circuit.

30. The system of claim 27, wherein the common-mode control circuit further comprises:

a selected common-mode voltage detector of the plurality of common-mode voltage detectors, the selected common-mode voltage detector operative to provide a second common-mode voltage from the reference voltage;

an inverter operative to provide the control voltage signal; and a selected buffer circuit of the plurality of buffer circuits, the selected buffer circuit coupled to the selected common-mode voltage detector and to the inverter, the selected buffer circuit operative to adjust the second common-mode voltage using the control voltage signal.

* * * * *